(12) United States Patent  
Kuan

(10) Patent No.: US 9,509,268 B2  
(45) Date of Patent: Nov. 29, 2016

(54) SIGNAL AMPLIFYING SYSTEM, AC SIGNAL GENERATING CIRCUIT, AMPLIFYING GAIN ACQUIRING METHOD, AND AC SIGNAL GENERATING METHOD

(71) Applicant: MEDIATEK INC., Hsin-Chu (TW)

(72) Inventor: Chih-Yi Kuan, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 10 days.

(21) Appl. No.: 14/533,072

(22) Filed: Nov. 4, 2014

(65) Prior Publication Data

US 2016/0126911 A1 May 5, 2016

(51) Int. Cl.
*G01R 19/00* (2006.01)
*H03G 3/20* (2006.01)
*H03G 3/30* (2006.01)

(52) U.S. Cl.
CPC ....... *H03G 3/3036* (2013.01); *H03F 2200/405* (2013.01); *H03F 2200/447* (2013.01)

(58) Field of Classification Search
CPC .......... H03F 1/211; H03F 1/26; H03F 1/302; H03F 1/307; H03F 1/3233; H03F 1/3247; H03F 3/45183; H03G 1/0023; H03G 1/0088; H03G 3/22; H03G 3/3042; H03G 3/3052; H03G 3/3068; H03G 7/02
USPC ............ 324/123, 124; 327/53, 66, 132, 201, 327/222, 330, 490; 330/2, 75, 129, 254, 330/257, 272, 278, 279, 288; 341/118, 155; 455/136, 232.1, 234.1, 239.1, 245.1, 455/245.2, 247.1, 250.1
See application file for complete search history.

(56) References Cited

U.S. PATENT DOCUMENTS

| | | | |
|---|---|---|---|
| 5,844,443 A * | 12/1998 | Wong | H03F 1/307 330/275 |
| 6,373,338 B1 * | 4/2002 | Phanse | H03F 3/45183 330/257 |
| 7,161,418 B2 * | 1/2007 | Boos | H03G 3/3042 330/2 |
| 7,782,136 B2 | 8/2010 | Kocaman | |

* cited by examiner

*Primary Examiner* — Steven J Mottola  
*Assistant Examiner* — Hafizur Rahman  
(74) *Attorney, Agent, or Firm* — Winston Hsu; Scott Margo

(57) ABSTRACT

A signal amplifying system comprising: an amplifying module with a plurality of PGAs coupled in series; a test signal generating circuit, for generating a test signal fed to one test input PGA; and a control circuit. If the test input PGA is not a final PGA, the final PGA outputs an output test signal amplified by the test input PGA and the PGA following the test input PGA, wherein each of the PGA following the test input PGA has a known amplifying gain. The control circuit acquires an accumulated gain for the test input PGA and the PGA following the test input PGA based on the output test signal, and acquires an amplifying gain of the test input PGA based on the accumulated gain.

17 Claims, 11 Drawing Sheets

SIGNAL AMPLIFYING SYSTEM, AC SIGNAL GENERATING CIRCUIT, AMPLIFYING GAIN ACQUIRING METHOD, AND AC SIGNAL GENERATING METHOD

BACKGROUND

FIG. 1 is a schematic diagram illustrating an amplifying module 100 for related art. As shown in FIG. 1, the amplifying module 100 comprises PGAs (programmable gain amplifier) A1-A5 coupled in series. An input signal INS transmitted to the programmable gain amplifier A1 will be amplified by all programmable gain amplifiers A1-A5 to generate an output signal OS.

Each programmable gain amplifier has a limit for its input/output swing. However, since the swing of each stage but the last (A5) in the programmable gain amplifier cannot be easily acquired (ex. A1-A4), the intermediate signal swing in such programmable gain amplifiers may saturate if all stages' amplifying gains thereof are not well controlled.

Additionally, the amplifying gains may drift due to PVT (process, voltage, temperature) variation, thus a good mechanism for acquiring or tuning amplifying gains is desired.

SUMMARY

Therefore, one objective of the present application is to provide a signal amplifying system and an amplifying gain acquiring method, that can acquire the amplifying gain for the PGA which is not the final PGA.

Another objective of the present application is to provide an AC signal generating circuit and an AC signal generating method that can generate an AC signal for avoiding DC blocking.

One embodiment of the present application discloses: a signal amplifying system, which comprises: an amplifying module, comprising a plurality of programmable gain amplifiers coupled in series; a test signal generating circuit, for generating a test signal fed to one test input programmable gain amplifier of the programmable gain amplifiers; and a control circuit. If the test input programmable gain amplifier is not a final programmable gain amplifier of the programmable gain amplifiers, the final programmable gain amplifier of the programmable gain amplifiers outputs an output test signal amplified by the test input programmable gain amplifier and the programmable gain amplifier following the test input programmable gain amplifier, wherein each the programmable gain amplifier following the test input programmable gain amplifier has a known amplifying gain. If the test input programmable gain amplifier is the final programmable gain amplifier, the test input programmable gain amplifier directly amplifies the test signal to generate the output test signal. If the test input programmable gain amplifier is not the final programmable gain amplifier, the control circuit acquiring an accumulated gain for the test input programmable gain amplifier and the programmable gain amplifier following the test input programmable gain amplifier based on the output test signal, and acquiring an amplifying gain of the test input programmable gain amplifier based on the accumulated gain. If the test input programmable gain amplifier is the final programmable gain amplifier, the control circuit directly acquiring the amplifying gain of the test input programmable gain amplifier based on the output test signal. The control circuit is further arranged for adjusting the amplifying gain of the test input programmable gain amplifier.

Another embodiment of the present application discloses an AC signal generating circuit, which comprises: an input current generating circuit, for generating an input current; a first AC signal generating path; and a second AC signal generating path. The first AC signal generating path and the second AC signal generating path alternatively turns on, thereby the AC signal is generated by the first AC signal generating path and the second AC signal generating path based on the input current.

An amplifying gain acquiring method and an Ac signal generating method can be acquired according to above-mentioned embodiments, but are omitted for brevity here.

In view of above-mentioned embodiments, PGA gains for the PGAs which are not the final PGA can be acquired or calibrated, thus the total gain of the amplifying circuit can be more precise. Additionally, an AC signal can be provided as the test signal, thus the PGAs can still be calibrated even a DC blocking mechanism exists.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
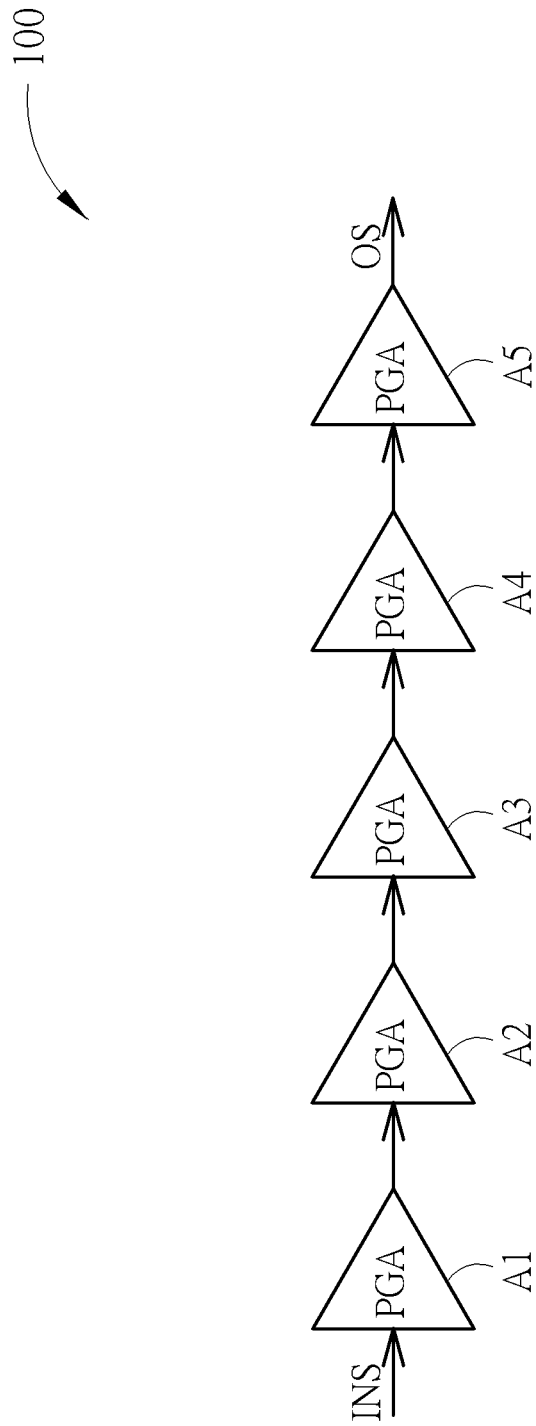
FIG. 1 is a schematic diagram illustrating an amplifying module for related art.
Figure 2:
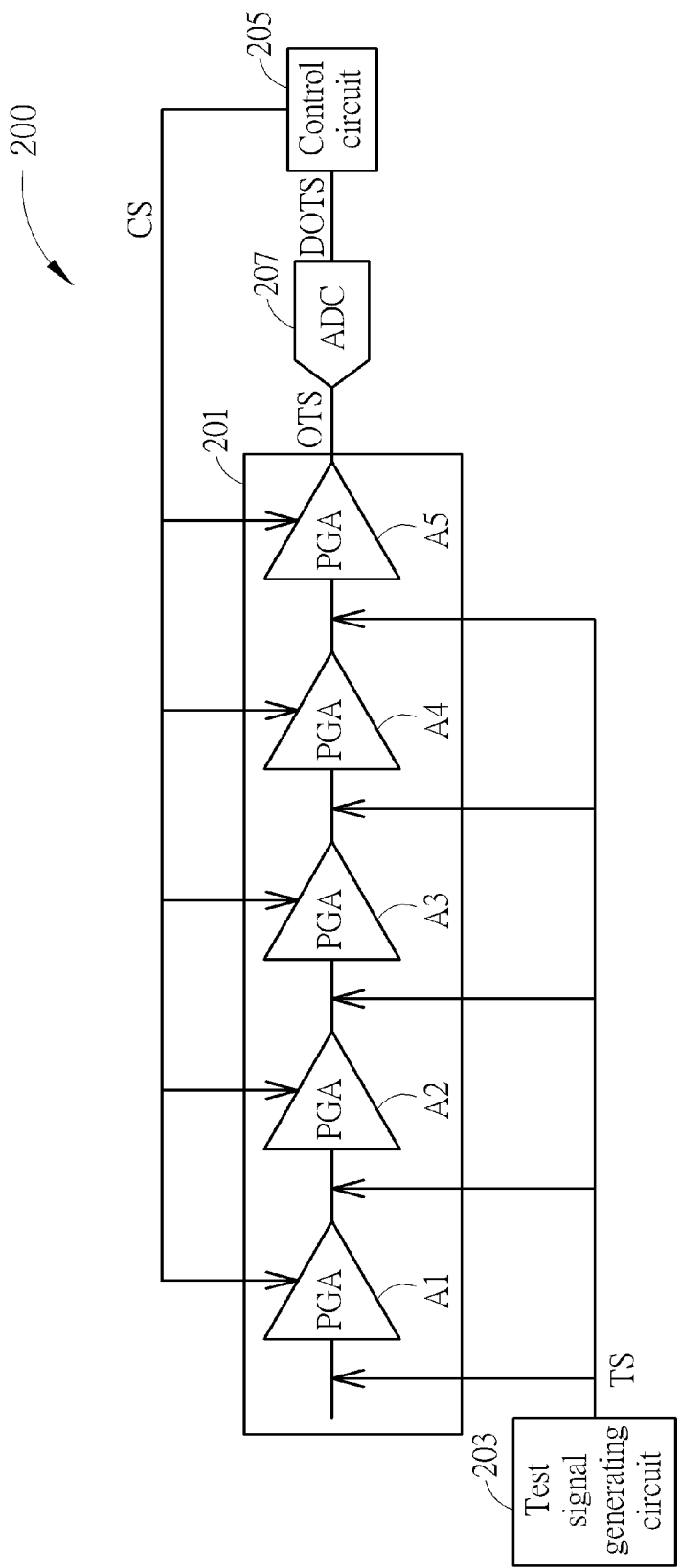
FIG. 2 is a circuit diagram illustrating a signal amplifying system according to one embodiment of the present application.

FIG. 2 is a circuit diagram illustrating a signal amplifying system 200 according to one embodiment of the present application. As illustrated in FIG. 2, the signal amplifying system 200 comprises: an amplifying module 201, a test signal generating circuit 203, and a control circuit 205.

The amplifying module 201 comprises a plurality of PGAs coupled in series (five PGAs A1-A5 in following examples, but not limited). The test signal generating circuit 203 generates a test signal TS fed to one test input PGA of the PGAs. If the test input PGA is not the final PGA A5, the final PGA A5 outputs an output test signal OTS amplified by the test input PGA and the PGA following the test input PGA, wherein the PGA (or PGAs) following the test input PGA has a known amplifying gain. For example, if the test input PGA is the PGA A3, the final PGA A5 outputs an output test signal OTS amplified by the PGAs A3, A4, A5. On the contrary, if the test input PGA is the final PGA A5, the test input PGA directly amplifies the test signal TS to generate the output test signal OTS.

The control circuit 205 is arranged to acquire an amplifying gain of the test input PGA, and can be applied to adjust the amplifying gain of the test input PGA as well. If the test input PGA is not the final PGA A5, the control circuit 205 acquires an accumulated gain for the test input PGA and the PGA (or PGAs) following the test input PGA based on the output test signal OTS. In above-mentioned example, if the test input PGA is the PGA A3, the control circuit 205 acquires an accumulated gain G3*G4*G5, which respectively belong to the PGAs A3, A4, A5, based on the output test signal OTS. After that, the control circuit can acquire an amplifying gain G3 of the test input PGA based on the accumulated gain (G3*G4*G5), since the amplifying gains G4, G5 are already know. The amplifying gains G4, G5 can be acquired by various methods, which will be described later. On the contrary, if the test input PGA is the final PGA A5, the control circuit 205 directly acquires the amplifying gain of the test input PGA based on the output test signal OTS.

In one embodiment, an analog to digital converter 207 is provided to receive the output test signal OTS, and converts the output test signal OTS to a digital output test signal DOTS. In such case, the control circuit 205 acquires the accumulated gain for PGAs or the amplifying gain for the final PGA, based on the swing of the analog to digital converter 207.

FIG. 3-FIG. 7 are schematic diagrams illustrating the gain calibrating operation for the signal amplifying system depicted in FIG. 2, according to one embodiment of the present application. It will be appreciated that the operations illustrated in FIG. 3-FIG. 7 are only for examples and do not mean to limit the scope of the present application.

Figure 3:
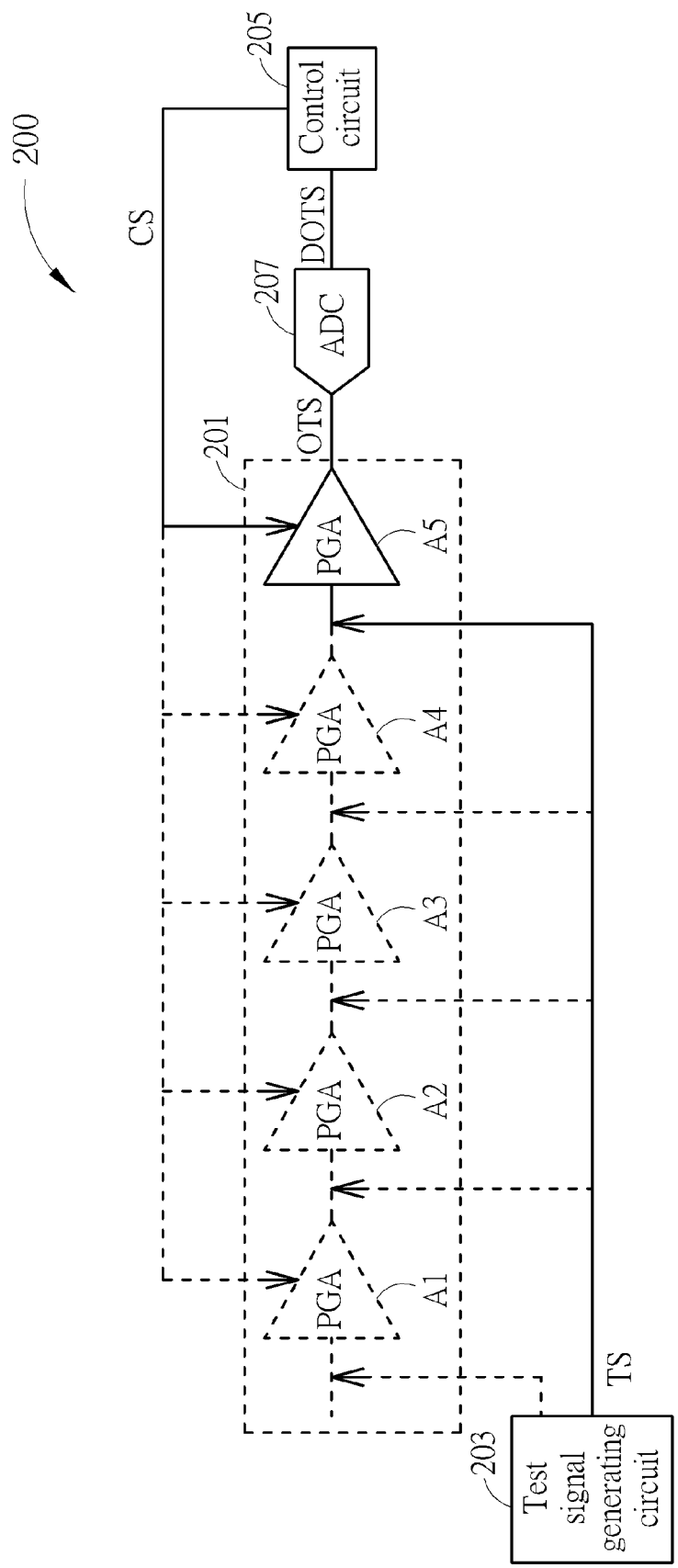
FIG. 3-FIG. 7 are schematic diagrams illustrating the gain calibrating operation for the signal amplifying system depicted in FIG. 2, according to one embodiment of the present application.
Figure 4:
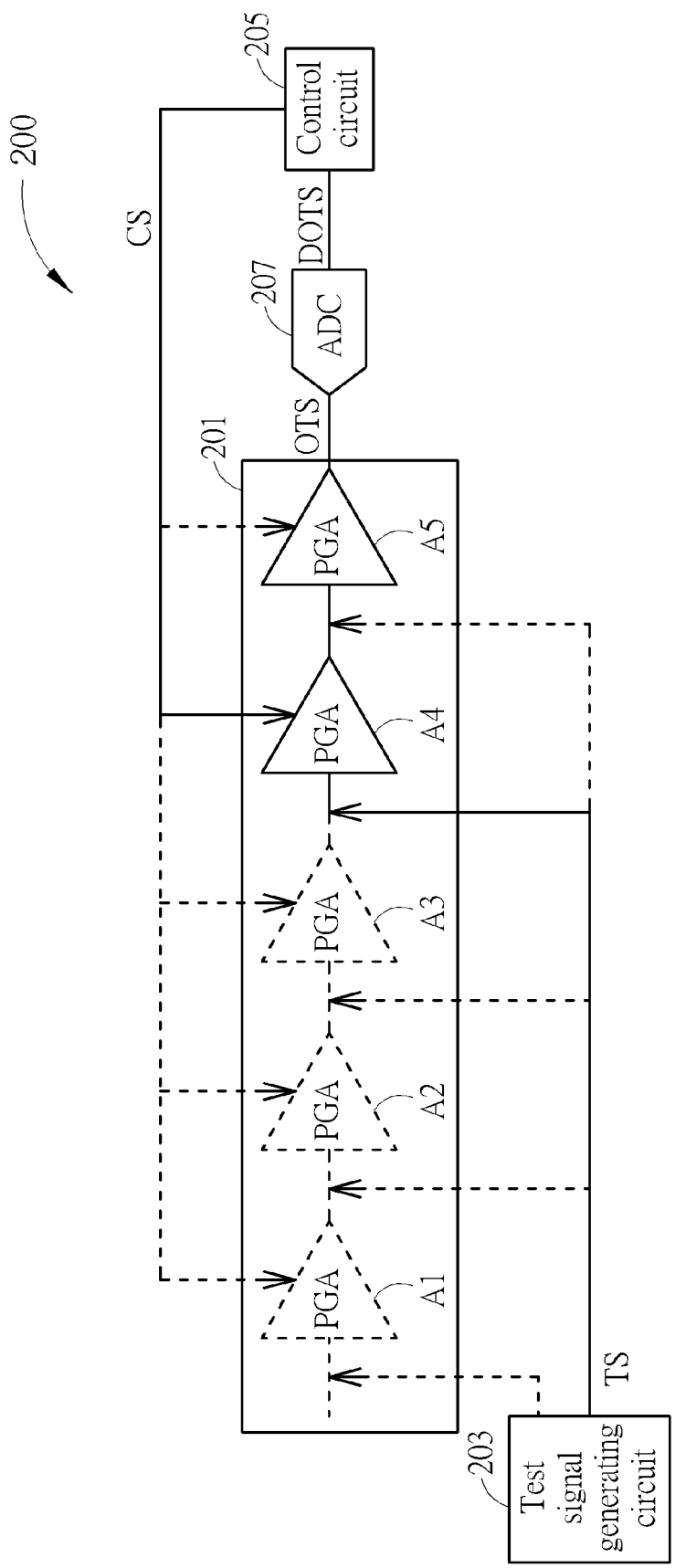

As depicted in FIG. 3, the test signal TS is firstly fed to an input terminal of the final PGA A5, and the control circuit 205 can acquire the amplifying gain G5 of the final PGA A5 based on the output test signal OTS. In one embodiment, the control circuit 205 further adjusts the amplifying gain G5 to a predetermined value (ex. 0 dB). After the operation in FIG. 3, the test signal TS is fed to an input terminal of the PGA A4, and the control circuit 205 can acquire the accumulated gain G4*G5 of the PGA A4 and final PGA A5, based on the output test signal OTS, as depicted in FIG. 4. Since the amplifying gain G5 of the final PGA A5 is already known in the above-mentioned step, the amplifying gain G4 of the PGA A4 can be accordingly acquired according to the accumulated gain G4*G5 and the amplifying gain G5. In one embodiment, the control circuit 205 further adjusts the amplifying gain G4 to a predetermined value (ex. 0 dB).

Figure 5:
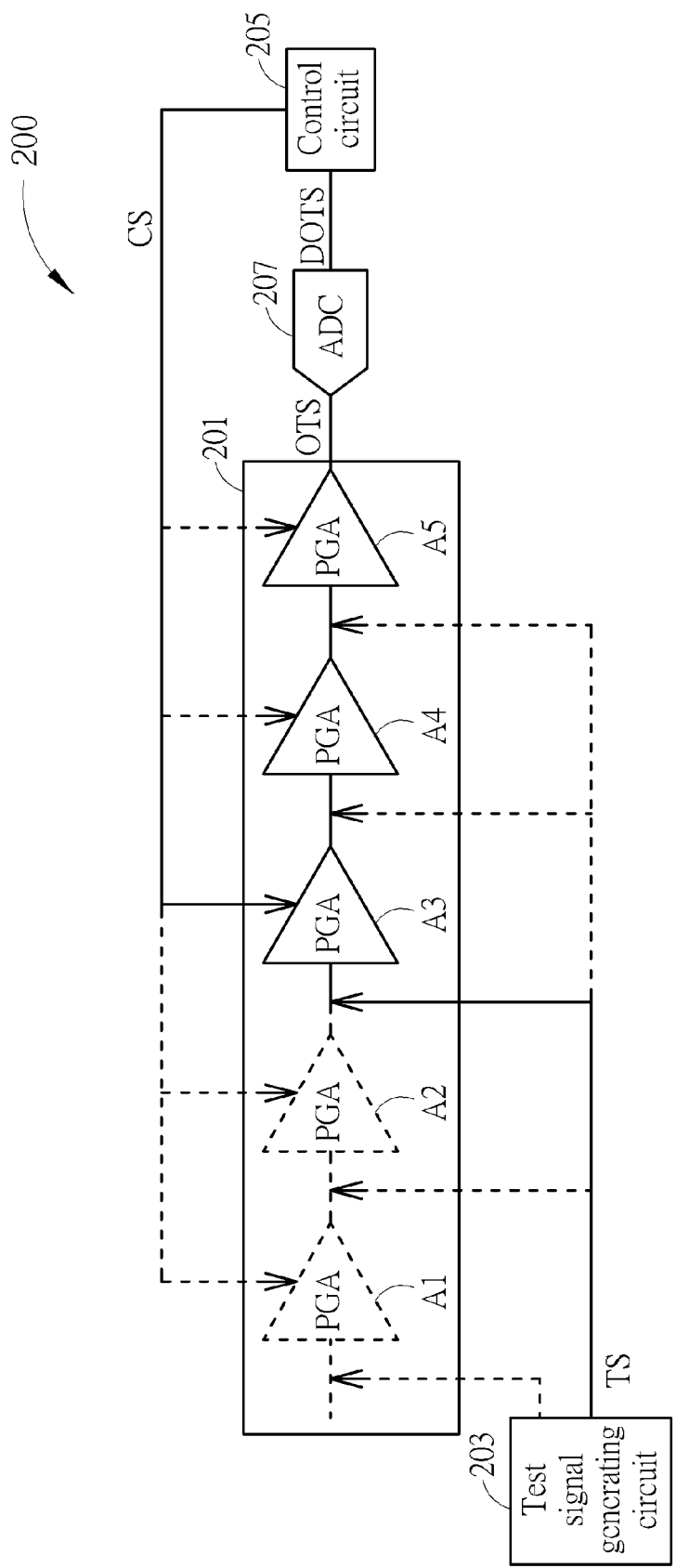

After the operation in FIG. 4, the test signal TS is fed to an input terminal of the PGA A3, and the control circuit 205 can acquire the accumulated gain G3*G4*G5 of the PGA A3, the PGA A4 and final PGA A5, based on the output test signal OTS, as depicted in FIG. 5. Since the amplifying gain G5 of the final PGA A5 and the amplifying gain of the PGA A4 are already known in the above-mentioned steps, the amplifying gain G3 of the PGA A3 can be accordingly acquired according to the accumulated gain G3*G4*G5, the amplifying gain G4 and the amplifying gain G5. In one embodiment, the control circuit 205 further adjusts the amplifying gain G3 to a predetermined value (ex. 0 dB).

Figure 6:
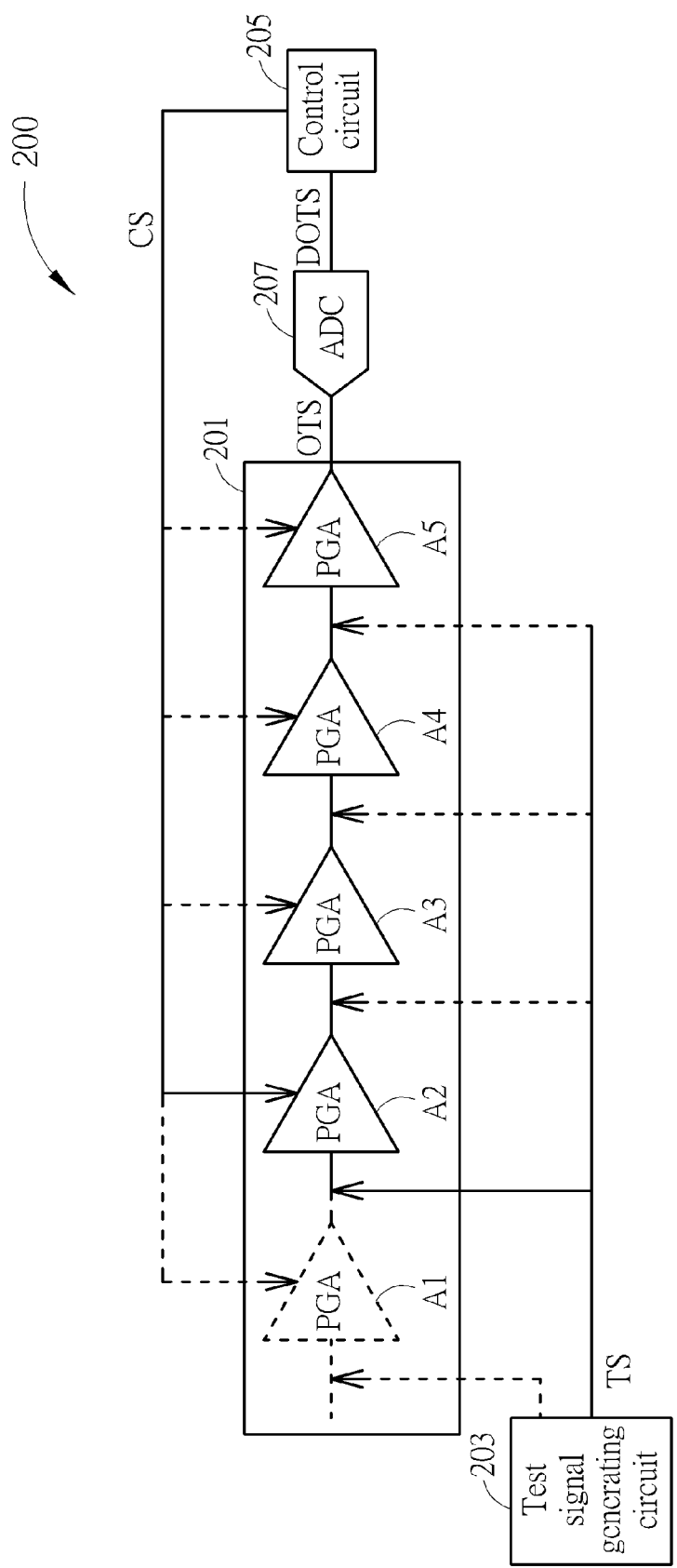
Figure 7:
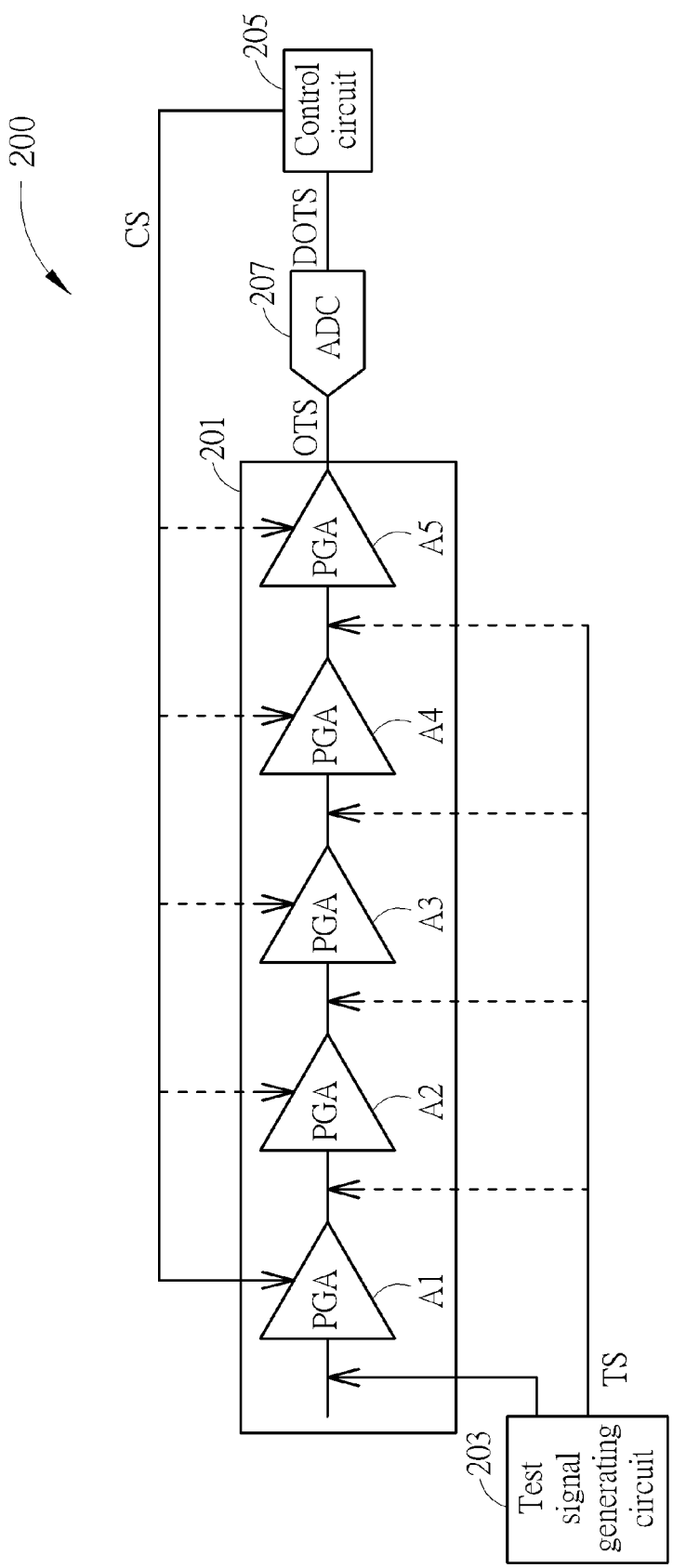

In FIG. 6 and FIG. 7, the test signal TS is respectively fed to the PGA G2 and the PGA G1. Following the operations in FIG. 4 and FIG. 5, the amplifying gain A2 for the PGA G2, and the amplifying gain A1 for the PGA G1 can be respectively acquired. In one embodiment, the control circuit 205 further adjusts the amplifying gain G1 and the amplifying gain G2 to a predetermined value (ex. 0 dB).

The operation depicted in FIG.3-FIG.7 can be summarized as: the test signal TS is firstly fed to an input terminal of the final PGA A5, and the control circuit 205 firstly acquires an amplifying gain of the final PGA A5. After that the test signal TS is sequentially and respectively fed to an input terminal for each of the PGA previous to the final PGA A5, thereby the control circuit respectively acquires the amplifying gain for each of the PGA previous to the final PGA.

The test signal TS can be firstly fed to any PGA besides the final PGA. Take FIG. 6 for example, the test signal is firstly fed to the PGA G2, and the accumulated gain G2*G3*G4*G5 can be acquired. If the amplifying gains G3, G4, G5 are already known, the amplifying gain G2 can be acquired accordingly. Such operation can be applied corresponding to different requirements, take FIG. 6 for example, the PGAs A3, A4, A5 are PGAs with high quality (but also high cost), thus have precise gains. Therefore, only the PGAs A1, A2 with low cost but low quality needed to be calibrated. Also, in one embodiment, the PGA (or PGAs) previous to the test input PGA is disabled.

After above-mentioned gain calibration, the amplifying gains for PGAs can be acquired or can be adjusted to a predetermined value, thus the control circuit can be applied to perform an automatic gain control operation in the following process. That is, the control circuit monitors the total gain generated by all amplifying stages, and gradually adjusts the total gain to a desired value. Many methods can be applied to adjust the total gain. For example, the control circuit 203 provides a control code CS (ex. 10001100 . . . ) to one PGA, if the total gain is still smaller than desired value, the control circuit 203 provides another control code to increase PGA to increase the total gain. In one embodiment, the control circuit 203 adjusts the amplifying gain for only one PGA for each time, and does not adjusts the amplifying gain for the same PGA in two successive times. However, please note the method for automatic gain control is not limited to above-mentioned examples.

Figure 8:
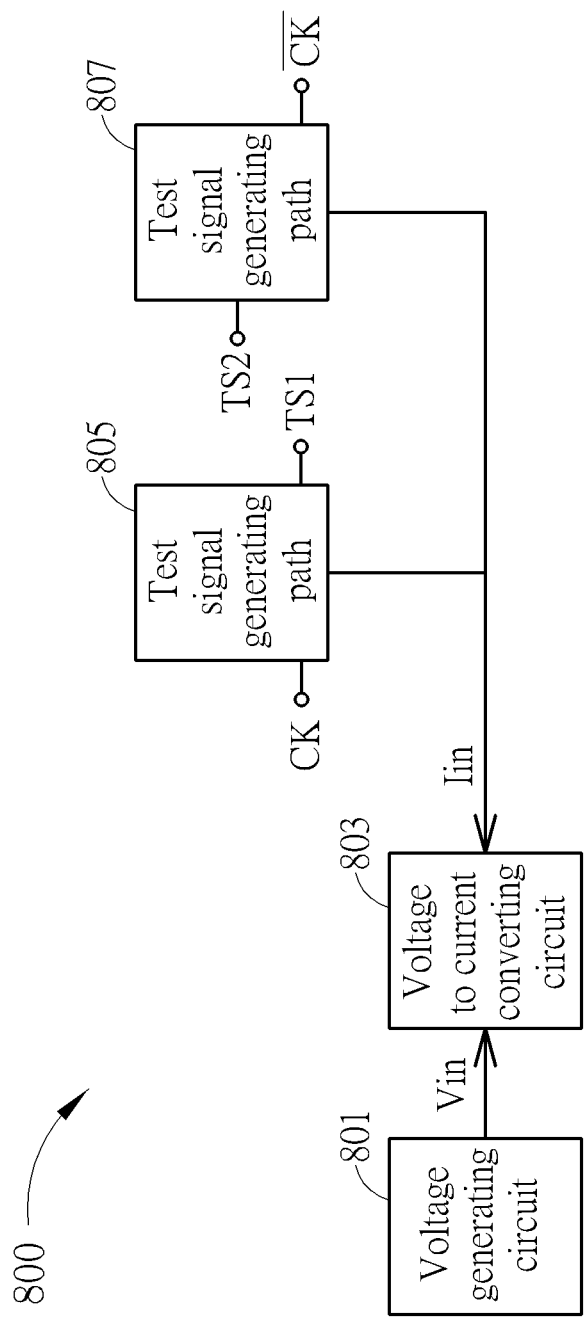
FIG. 8 is a block diagram illustrating an AC signal generating circuit according to one embodiment of the present application.

In one embodiment, the test signal is an AC (alternating current) signal with a predetermined amplitude, by this way the amplifying gain for each PGA can still be acquired or adjusted even a DC (direct current) blocking mechanism exists in the signal amplifying system. FIG. 8 is a block diagram illustrating an AC signal generating circuit according to one embodiment of the present application. As illustrated in FIG. 8, the test signal generating circuit 800 comprises: a voltage generating circuit 801, a voltage to current converting circuit 803, a first test signal generating path 805 and a second test signal generating path 807. The voltage generating circuit 801 (ex. a Vbg voltage generating circuit) provides an input voltage Vin with a predetermined voltage level. The voltage to current converting circuit 803 converts the input voltage Vin to an input current Iin. In one embodiment, the input current Iin is drained to the voltage to current converting circuit 803 rather than output from the voltage to current converting circuit 803.

The first test signal generating path 805 and the second test signal generating path 807 alternatively turns on by the control signals CK and an inversed signal for the control signal $\overline{CK}$, thereby the test signal TS is generated by the first test signal generating path 805 and the second test signal generating path 807 based on the input current Iin. For more detail, the second test signal generating path 807 is turned off when the first test signal generating path 805 is turned on to generate a signal TS1. On the contrary, the first test signal generating path 805 is turned off when the second test signal generating path 807 is turned on to generate a signal TS2. In such case, the test signal TS is a differential signal formed by the signal TS1 and TS2.

Figure 9:
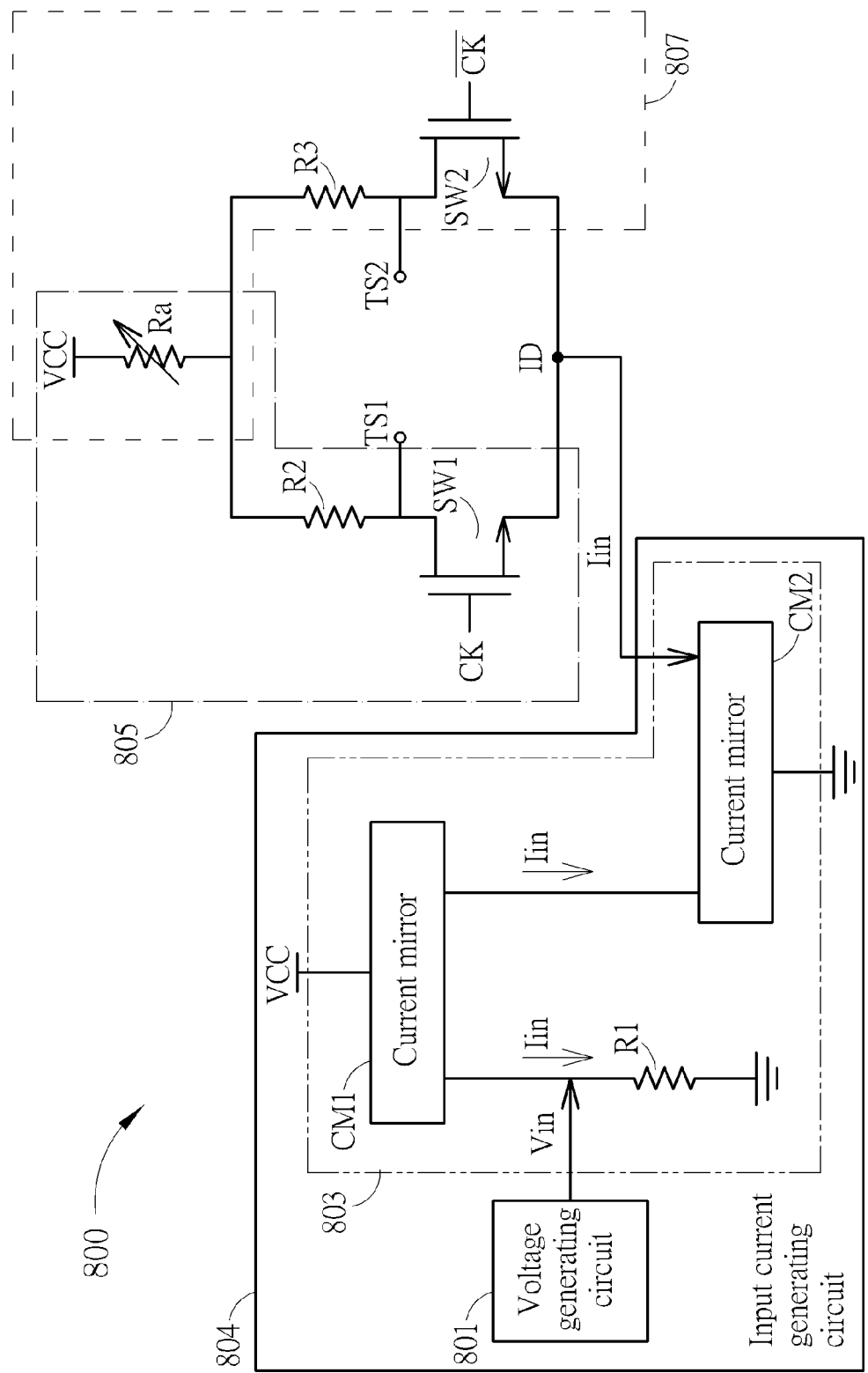
FIG. 9 is a circuit diagram illustrating an exemplary circuit for the AC signal generating circuit depicted in FIG. 8, according to one embodiment of the present application.

FIG. 9 is a circuit diagram illustrating an exemplary circuit for the AC signal generating circuit depicted in FIG. 8, according to one embodiment of the present application. As illustrated in FIG. 9, the voltage to current converting circuit 803 comprises a first resistor R1, a first current mirror CM1 and a second current mirror CM2. The first current mirror CM1 is coupled to a first voltage level Vcc. The first resistor R1 comprises a first terminal coupled to the first terminal of the first current mirror CM1 and receiving the input voltage Vin, and comprises a second terminal coupled to a second voltage level (a ground level in this example). The second current mirror CM2 comprises a first terminal coupled to the second terminal of the first current mirror CM1, and comprising a second terminal.

The test signal generating circuit 800 comprises a current drain terminal ID, wherein the voltage to current converting circuit 803 drains the input current Iin from the current drain terminal ID via the second terminal of the second current mirror CM2. Please note the input current Iin can be sourced to the first test signal generating path 805 and the second test signal generating path 807 as well. The first test signal generating path 805 comprises: an adjustable resistor Ra, a second resistor R2, and a first switch device SW1. The adjustable resistor Ra comprises a first terminal coupled to a first predetermined voltage level Vcc, and comprises a second terminal. The second resistor R2 comprises a first terminal coupled to the second terminal of the adjustable resistor Ra, and comprises a second terminal. The first switch device SW1 comprises a first terminal coupled to the second terminal of the second resistor R2, a second terminal coupled to the current drain terminal ID, and a control terminal receiving a control signal CK. Similarly, the second test signal generating path 807 comprises: the adjustable resistor Ra, a third resistor R3, and a second switch device SW2. The third resistor R3 comprises a first terminal coupled to the second terminal of the adjustable resistor Ra, and comprises a second terminal. The second switch device SW2 comprises a first terminal coupled to the second terminal of the third resistor R3, a second terminal coupled to the current drain terminal ID, and a control terminal receiving an inversed signal for the control signal $\overline{CK}$.

The operation of the circuit illustrated in FIG. 9 can be summarized as follows: the voltage to current converting circuit 803 receives the input voltage Vin and then the input current Iin is generated and flows through the first resistor R1. The first current mirror CM1 mirrors the input current Iin to the first input terminal of the second current mirror CM2, and the second current mirror CM2 mirrors the input current Iin to the second input terminal thereof.

If the first test signal generating path 805 is turned on, that is, the first switch device SW1 is controlled by the control signal CK to be conductive, the input current Iin flows through the adjustable resistor Ra, the second resistor R2 and the first switch device SW1. By this way, the signal TS1 is generated at the second terminal of the second resistor R2. Please note the second test signal generating path 805 is turned on since it is controlled by the inversed signal for the control signal $\overline{CK}$.

Similarly, if the second test signal generating path 807 is turned on, that is, the second switch device SW2 is controlled by the inversed signal of the control signal $\overline{CK}$ to be conductive, the input current Iin flows through the adjustable resistor Ra, the third resistor R3 and the second switch device SW2. By this way, the signal TS2 is generated at the second terminal of the third resistor R3.

Please note the test signal generating circuit depicted in FIG. 8 and FIG. 9 is not limited to be applied to the signal amplifying system, it can be applied to any other circuit, device or system. For example, the voltage generating circuit 801 and the voltage to current converting circuit 803 can be regarded an input current generating circuit 804, which generates the input current Iin. As above-mentioned, the input current Iin can be drained from the first test signal generating path 805 and the second test signal generating path 807, or sourced to the first test signal generating path 805 and the second test signal generating path 807. The input current generating circuit 804 can have other structures besides the voltage generating circuit 801 and the voltage to current converting circuit 803 depicted in FIG. 9. In one example, the input current Iin can be generated by directly switching a precise current to multiply a pair of precise resistor, both of which can be obtained by trimming. Such variation should also fall in the scope of the present application.

In such case, the test signal generating circuit depicted in FIG. 8 and FIG. 9 can be regarded as an AC signal generating circuit.

Figure 10:
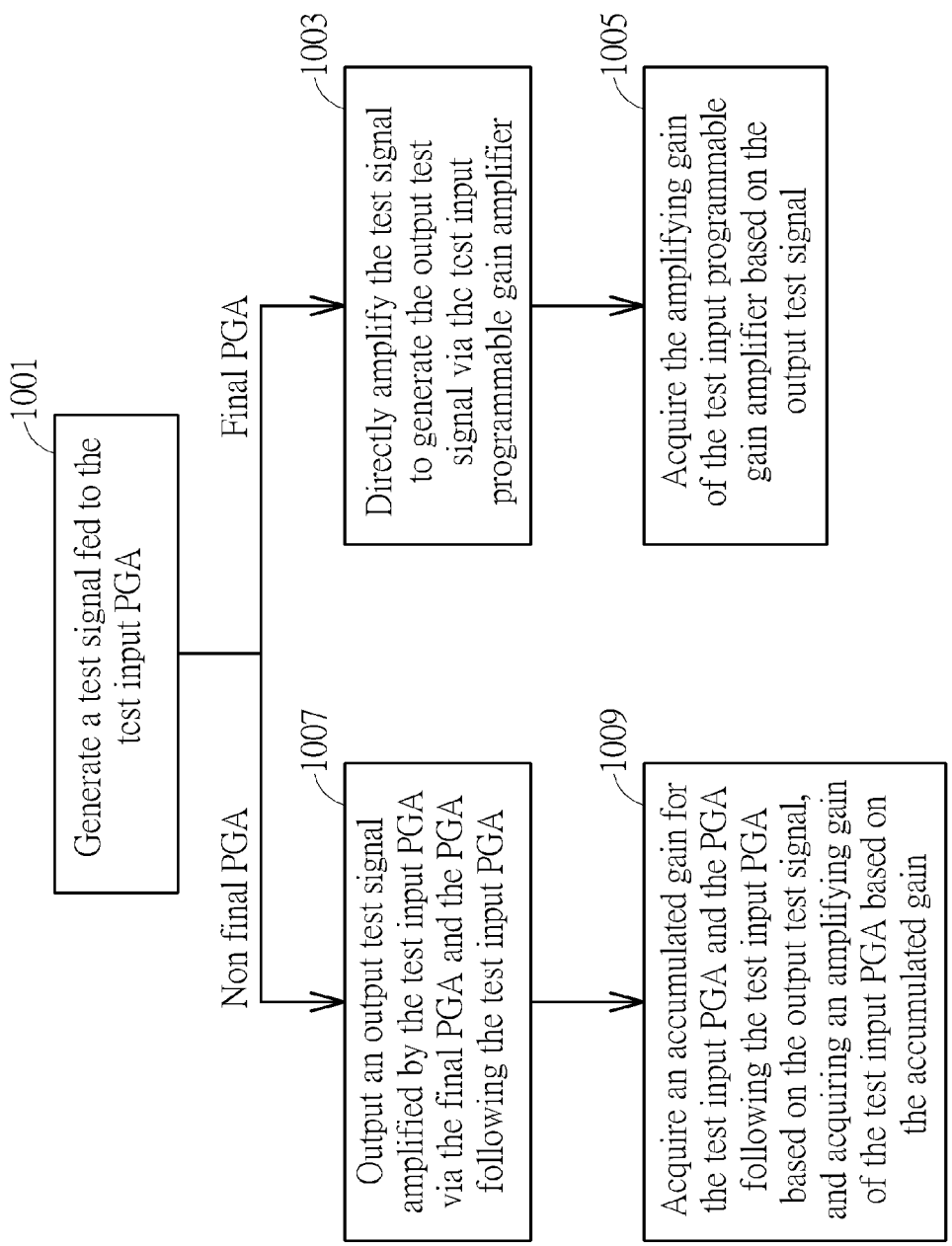
FIG. 10 is a flow chart illustrating an amplifying gain acquiring method according to one embodiment of the present application.

In view of above-mentioned embodiments, an amplifying gain acquiring method and an AC signal generating method are acquired. FIG. 10 is a flow chart illustrating an amplifying gain acquiring method according to one embodiment of the present application. The method in FIG. 10 comprises:

Step 1001

Generate a test signal fed to the test input PGA. If the test input PGA is a final PGA, steps 1003, 1005 are performed (ex. the example in FIG. 3). If the test input PGA is not a final PGA, steps 1007, 1009 are performed (ex. the examples in FIG. 4-FIG. 7).

Step 1003

Directly amplify the test signal to generate the output test signal via the test input programmable gain amplifier.

Step 1005

Acquire the amplifying gain of the test input programmable gain amplifier based on the output test signal.

Step 1007

Output an output test signal amplified by the test input PGA via the final PGA and the PGA following the test input PGA. Each of the PGA following the test input PGA has a known amplifying gain.

Step 1009

Acquire an accumulated gain for the test input PGA and the PGA following the test input PGA based on the output test signal, and acquiring an amplifying gain of the test input PGA based on the accumulated gain.

Figure 11:
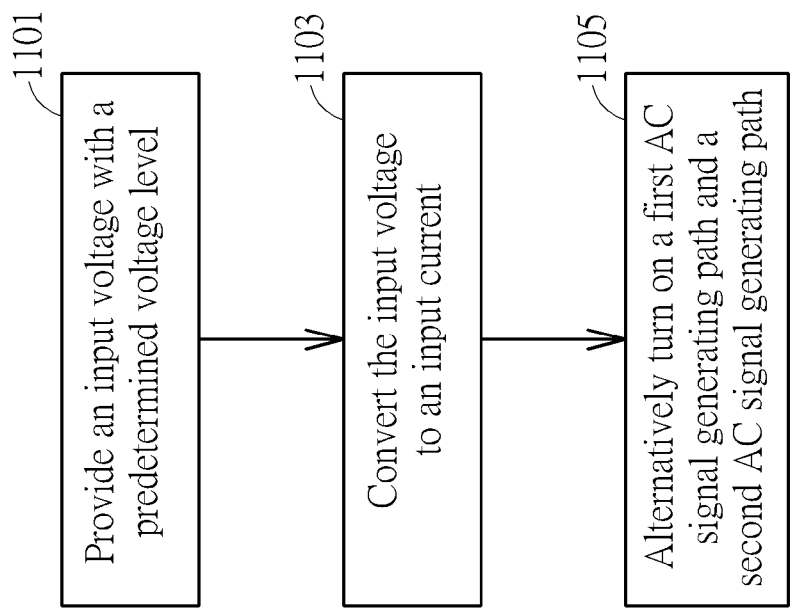
FIG. 11 is a flow chart illustrating an AC signal generating method according to one embodiment of the present application.

FIG. 11 is a flow chart illustrating an AC signal generating method according to one embodiment of the present application. FIG. 11 comprises the following steps:

Step 1101

Provide an input voltage with a predetermined voltage level (ex. Vin in FIG. 8).

Step 1103

Convert the input voltage to an input current (ex. Iin in FIG. 8)

Step 1105

Alternatively turn on a first AC signal generating path and a second AC signal generating path (ex. 805 and 807 in FIG. 8), thereby an AC signal is generated by the first AC signal generating path and the second AC signal generating path based on the input current.

In view of above-mentioned embodiments, PGA gains for the PGAs which are not the final PGA can be acquired or calibrated, thus the total gain of the amplifying circuit can be more precise. Additionally, an AC signal can be provided as the test signal, thus the PGAs can still be calibrated even a DC blocking mechanism exists.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal amplifying system, comprising:
   an amplifying module, comprising a plurality of programmable gain amplifiers coupled in series;
   a test signal generating circuit, for generating a test signal fed to one test input programmable gain amplifier of the programmable gain amplifiers,
      if the test input programmable gain amplifier is not a final programmable gain amplifier of the programmable gain amplifiers, the final programmable gain amplifier of the programmable gain amplifiers outputs an output test signal amplified by the test input programmable gain amplifier and the programmable gain amplifier following the test input programmable gain amplifier, wherein each the programmable gain amplifier following the test input programmable gain amplifier has a known amplifying gain;
      if the test input programmable gain amplifier is the final programmable gain amplifier, the test input programmable gain amplifier directly amplifies the test signal to generate the output test signal;
   a control circuit,
      if the test input programmable gain amplifier is not the final programmable gain amplifier, the control circuit acquiring an accumulated gain for the test input programmable gain amplifier and the programmable gain amplifier following the test input programmable gain amplifier based on the output test signal, and acquiring an amplifying gain of the test input programmable gain amplifier based on the accumulated gain;
      if the test input programmable gain amplifier is the final programmable gain amplifier, the control circuit directly acquiring the amplifying gain of the test input programmable gain amplifier based on the output test signal;
   wherein the control circuit is further arranged for adjusting the amplifying gain of the test input programmable gain amplifier.

2. The signal amplifying system of claim 1, further comprising:
   an analog to digital converter, coupled to the final programmable gain amplifier, for receiving the output test signal and converting the output test signal to a digital output test signal;
   wherein the control circuit acquires the accumulated gain based on an output swing of the analog to digital converter.

3. The signal amplifying system of claim 1, wherein the control circuit disables all the programmable gain amplifiers previous to the test input programmable gain amplifier.

4. The signal amplifying system of claim 1, wherein the test signal is firstly fed to an input terminal of the final programmable gain amplifier, and the control circuit firstly acquires an amplifying gain of the final programmable gain amplifier, after that the test signal is sequentially and respectively fed to an input terminal for each the programmable gain amplifier previous to the final programmable gain amplifier thereby the control circuit respectively acquires the amplifying gain for each the programmable gain amplifier previous to the final programmable gain amplifier.

5. The signal amplifying system of claim 1, wherein the test signal is an AC signal with a predetermined amplitude.

6. The signal amplifying system of claim 5, wherein the test signal generating circuit comprises:
   an input current generating circuit, for generating an input current;
   a first test signal generating path; and
   a second test signal generating path;
   wherein the first test signal generating path and the second test signal generating path alternatively turns on, thereby the test signal is generated by the first test signal generating path and the second test signal generating path based on the input current.

7. The signal amplifying system of claim 6, wherein the input current generating circuit comprises:
   a voltage generating circuit, for providing an input voltage with a predetermined voltage level;
   a voltage to current converting circuit, for converting the input voltage to the input current.

8. The signal amplifying system of claim 7,
   wherein the voltage to current converting circuit comprises:
      a first current mirror, coupled to a first voltage level, comprising a first terminal and a second terminal;
      a first resistor, comprising a first terminal coupled to the first terminal of the first current mirror and receiving the input voltage, and comprising a second terminal coupled to a second voltage level;
      a second current mirror, comprising a first terminal coupled to the second terminal of the first current mirror, and comprising a second terminal for draining the input current from the first test signal generating path and the second test signal generating path, or for sourcing the input current to the first test signal generating path and the second test signal generating path.

9. The signal amplifying system of claim 6,
   wherein the test signal generating circuit comprises:
      a current drain terminal, wherein the voltage to current converting circuit drains the input current from the current drain terminal;
   wherein the first test signal generating path comprises:
      an adjustable resistor, comprising a first terminal coupled to a first predetermined voltage level, and comprising a second terminal;
      a second resistor, comprising a first terminal coupled to the second terminal of the adjustable resistor, and comprising a second terminal;
      a first switch device, comprising a first terminal coupled to the second terminal of the second resistor, a second terminal coupled to the current drain terminal, and a control terminal receiving a control signal;
   wherein the second test signal generating path comprises:
      the adjustable resistor;
      a third resistor, comprising a first terminal coupled to the second terminal of the adjustable resistor, and comprising a second terminal;
      a second switch device, comprising a first terminal coupled to the second terminal of the third resistor, a second terminal coupled to the current drain terminal, and a control terminal receiving an inversed signal for the control signal;

wherein a signal output at the second terminal of the second resistor and a signal output at the second terminal of the third resistor for the test signal.

10. An amplifying gain acquiring method, for acquiring an amplifying gain for a test input programmable gain amplifier in an amplifying module, comprising:

generating a test signal fed to the test input programmable gain amplifier;

if the test input programmable gain amplifier is not a final programmable gain amplifier of the programmable gain amplifiers, outputting an output test signal amplified by the test input programmable gain amplifier via the final programmable gain amplifier of the programmable gain amplifiers and the programmable gain amplifier following the test input programmable gain amplifier, wherein each the programmable gain amplifier following the test input programmable gain amplifier has a known amplifying gain;

if the test input programmable gain amplifier is the final programmable gain amplifier, directly amplifying the test signal to generate the output test signal via the test input programmable gain amplifier;

if the test input programmable gain amplifier is not the final programmable gain amplifier, acquiring an accumulated gain for the test input programmable gain amplifier and the programmable gain amplifier following the test input programmable gain amplifier based on the output test signal, and acquiring an amplifying gain of the test input programmable gain amplifier based on the accumulated gain;

if the test input programmable gain amplifier is the final programmable gain amplifier, acquiring the amplifying gain of the test input programmable gain amplifier based on the output test signal.

11. The amplifying gain acquiring method of claim 10, further comprising:

receiving the output test signal and converting the output test signal to a digital output test signal via an analog to digital converter; and acquiring the accumulated gain based on an output swing of the analog to digital converter.

12. The amplifying gain acquiring method of claim 10, further comprising:

disabling all the programmable gain amplifiers previous to the test input programmable gain amplifier.

13. The amplifying gain acquiring method of claim 10, further comprising:

firstly selecting the final programmable gain amplifier as the test input programmable gain amplifier and firstly acquires an amplifying gain of the final programmable gain amplifier; and after the amplifying gain of the final programmable gain amplifier is acquired, the test signal is sequentially and respectively fed to an input terminal for each the programmable gain amplifier previous to the final programmable gain amplifier thereby the control circuit respectively acquires the amplifying gain for each the programmable gain amplifier previous to the final programmable gain amplifier.

14. The amplifying gain acquiring method of claim 10, wherein the test signal is an AC signal with a predetermined amplitude.

15. The amplifying gain acquiring method of claim 14, wherein the step of generating a test signal fed to the test input programmable gain amplifier further comprises:

generating an input current; and alternatively turning on a first test signal generating path and a second test signal generating path, thereby the test signal is generated by the first test signal generating path and the second test signal generating path based on the input current.

16. The amplifying gain acquiring method of claim 15, wherein the step of generating an input current comprises:

providing an input voltage with a predetermined voltage level; and converting the input voltage to the input current.

17. The amplifying gain acquiring method of claim 16, wherein the step of converting the input voltage to the input current comprises:

converting the input voltage to the input current via a first resistor; and mirroring the input current such that the input current is drained from the first test signal generating path and the second test signal generating path or the input current is sourced to the first test signal generating path and the second test signal generating path.

* * * * *